United States Patent [19]
Thaller et al.

[11] Patent Number: 6,091,608
[45] Date of Patent: Jul. 18, 2000

[54] METHOD AND APPARATUS FOR SIMPLIFIED AND COMPACT COMPONENT ADDITION TO A PRINTED CIRCUIT BOARD

[75] Inventors: Kurt Michael Thaller, Acton; Eugene Smith, Ashburnham, both of Mass.

[73] Assignee: Compaq Computer Corporation, Houston, Tex.

[21] Appl. No.: 08/385,509

[22] Filed: Feb. 8, 1995

[51] Int. Cl.[7] .............................. H05K 1/11; H01R 23/68
[52] U.S. Cl. ........................ 361/784; 361/785; 361/791
[58] Field of Search ............................. 228/179.1, 180.1, 228/180.21; 29/830, 831–832, 837, 846, 868, 884; 361/784, 785–789, 790–792, 795

[56] References Cited

U.S. PATENT DOCUMENTS 2,937,358  5/1960  Bulger .
3,891,898  6/1975  Damon .
3,923,359  12/1975  Newsam .
4,054,939  10/1977  Ammon .
4,731,704  3/1988  Lochne .

*Primary Examiner*—Hyung-Sub Sough
*Assistant Examiner*—Anthony Dinkins
*Attorney, Agent, or Firm*—Hamilton, Brook, Smith & Reynold, P.C.

[57] ABSTRACT

A method and apparatus for attaching a set of components to a printed circuit board is presented. A second board includes the set of components to be attached to the printed circuit board. The second board attaches directly to the printed circuit board by attaching to pins of a through hole device, such as an application specific integrated circuit. The through hole device is mounted on one side of the printed circuit board. The through hole device includes pins which protrude to the other side of the printed circuit board. The second board attaches to the protruding pins on the other side of the printed circuit board.

10 Claims, 3 Drawing Sheets

METHOD AND APPARATUS FOR SIMPLIFIED AND COMPACT COMPONENT ADDITION TO A PRINTED CIRCUIT BOARD

BACKGROUND OF THE INVENTION

This invention relates generally to a printed circuit board, and more particularly to attaching one or more electrical circuit components to another electrical circuit component included on a printed circuit board.

As it is known in the art, a printed circuit board generally includes components, specifically electrical circuit components such as computer chips, resistors, capacitors and application specific integrated circuits. Producing the printed circuit board typically includes designing the printed circuit board by laying out various components and appropriately connecting the various components together. Once the design of the printed circuit board is complete, a large quantity of printed circuit boards is generally manufactured in accordance with the design. Large amounts of money, in terms of engineering and manufacturing time and resources, are typically expended to design and manufacture printed circuit boards.

Problems may arise when a printed circuit board needs modification. Modifications may be needed for a number of reasons. For example, a modification may be necessary to correct a problem with a component on the printed circuit board by adding other components, such as a plurality of capacitors and resistors.

Other modifications may be necessary to acquire additional functionality. For example, if a printed circuit board is included as part of a computer system, additional functionality may be achieved by adding a plurality of computer chips to an existing printed circuit board.

Adding components to a printed circuit board is typically done by hand soldering each additional component to the printed circuit board. In another technique, the additional components are glued on one side of printed circuit board and then each additional component is wired to another component on the printed circuit board.

Hand soldering and gluing the electrical components may not be suitable when adding a large quantity of components or when adding components that require connecting a large number of pins. In this case, these two methods may increase manufacturing cost and time.

Reliability and quality may also decrease since these two methods of attaching the additional components increase the chance for human error. Also, the attached components may protrude from the printed circuit board and may be disconnected from the printed circuit board as a result of physical movement or contact with other objects.

These two methods may impose an unacceptable restriction by not allowing an additional component to be placed in close physical proximity to another component, as may be required for example, for a correction in which additional capacitors are added to achieve a dampening effect. The dampening effect of a capacitor diminishes as the physical distance between the capacitor and the source to be dampened increases.

An alternative technique includes designing a new lay out of the printed circuit board to include the additional components while minimizing the distance between each additional component and its corresponding component.

Typically, a new layout may not be a feasible solution to incorporate a modification to a printed circuit board for a number of reasons. One reason may be due to time constraints. Typically, to meet production deadlines and schedules, there is insufficient time to layout a new design and to produce new printed circuit boards based on the new design. Too much additional time is required for this redesign and remanufacture a printed circuit board. Another reason may be due to cost constraints. For example, the money and time invested in the existing printed circuit board is wasted. Specifically, any printed circuit boards previously manufactured may be scrapped thereby greatly increasing costs in addition to not meeting existing production deadlines.

SUMMARY OF THE INVENTION

In accordance with the present invention is an apparatus comprising a first printed circuit board and a second printed circuit board. The first printed circuit board comprises a first electrical circuit component on a first side of the first printed circuit board. The first electrical circuit component has one or more pins that pass through one or more corresponding holes in the first printed circuit board. Each of the pins protrudes from an opposite side of said printed circuit board. The second printed circuit board has one or more holes and is mounted directly to the opposite side of the first printed circuit board. The pins of the first electrical circuit component protrude through at least one of the holes of the second printed circuit board. The second printed circuit board has one or more electrical circuit components connected to the first electrical circuit component.

Further, in accordance with the invention is a method of attaching a component to a first printed circuit board. The method comprises aligning a second printed circuit board with the first printed circuit board by aligning one or more corresponding holes in the second printed circuit board with one or more pins that protrude through the first printed circuit board. The first printed circuit board comprises an electrical component on a first side of the first printed circuit board. The electrical component has one or more pins that protrude through the first printed circuit board. In response to the aligning step, the second printed circuit board is placed over an opposite side of the first printed circuit board. In response to the placing step, the second printed circuit board is soldered to the first printed circuit board by soldering at least one of the pins of the electrical circuit component that protrudes through the first printed circuit board to another electrical circuit component included in the second printed circuit board.

With such an arrangement, a modification may be applied to a printed circuit board in a cost and time efficient manner without adversely affecting testing and manufacturing reliability of the printed circuit board. The arrangement is flexible so that a wide range of different modifications may be applied to the printed circuit board. Additionally, with such an arrangement, a modification to a printed circuit board may be done efficiently with a minimal amount of associated cost and time and without imposing or limiting an effect of the modification, such as limit the physical proximity of capacitors added to dampen voltage produced by a component.

BRIEF DESCRIPTION OF THE DRAWINGS

The above-mentioned and other features of the invention will become more apparent by reference to the following description taken in connection with the accompanying drawings in which.

DETAILED DESCRIPTION OF PREFERRED EMBODIMENTS

The invention is particularly applicable to attaching components to a printed circuit board to correct a problem with a component on the printed circuit board and will be described in that context. However, as will become apparent, the invention has greater utility and is applicable to numerous situations in which, generally, a modification to the printed circuit board by adding components is desirable.

Figure 1A:
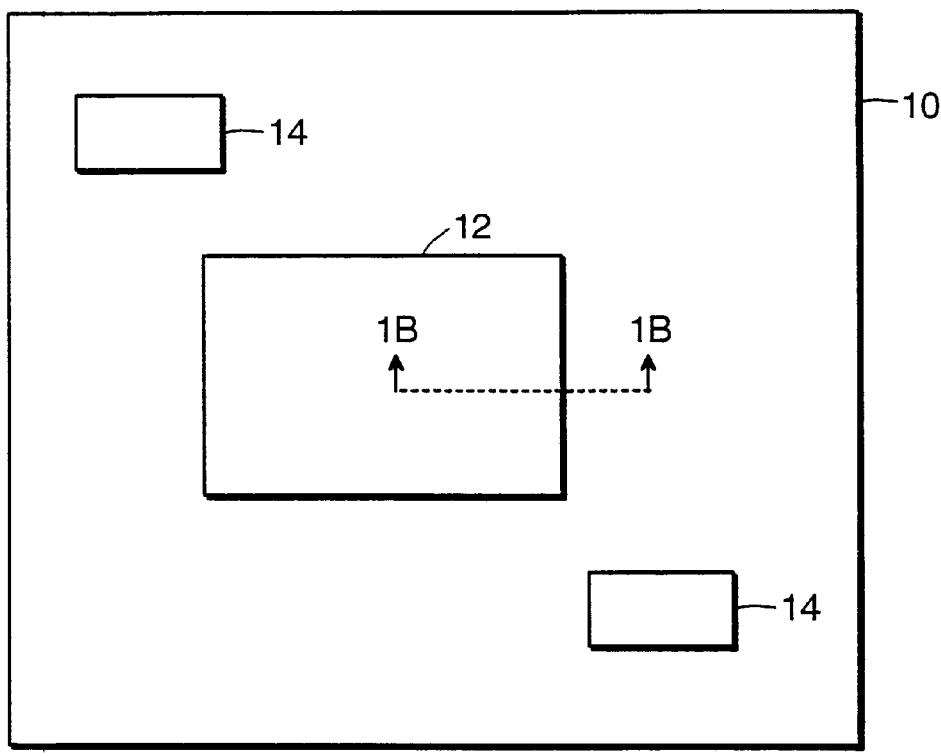
FIG. 1A is plan view from a first side of a first printed circuit board.

Referring now to FIG. 1A, a first printed circuit board that comprises a portion of an apparatus which may embody the invention is shown. The first printed circuit board 10 generally includes one or more electrical circuit components 12, such as a central processing unit (CPU), a simple integrated circuit, or very large scale integrated circuit, and resistors 14.

A modification to one of the electrical circuit components populating the first printed circuit board, such as the integrated circuit 12, may be required, for example, to correct a problem discovered after a first run of printed circuit boards has been manufactured. Generally, the modification may require the addition of one or more electrical circuit components, such as capacitors and resistors. For example, the integrated circuit 12 may include a central processing unit (CPU) that requires a modification for signal integrity reasons. Additional electrical circuit components, such as capacitors, may be connected to one or more pins of the integrated circuit 12 to dampen, filter, or terminate a voltage signal produced by the integrated circuit 12.

The additional electrical circuit components are disposed on a second printed circuit board which is attached directly to one or more pins or leads of an electrical circuit component of the first printed circuit board, such as a pin or lead of the integrated circuit 12.

Figure 1B:
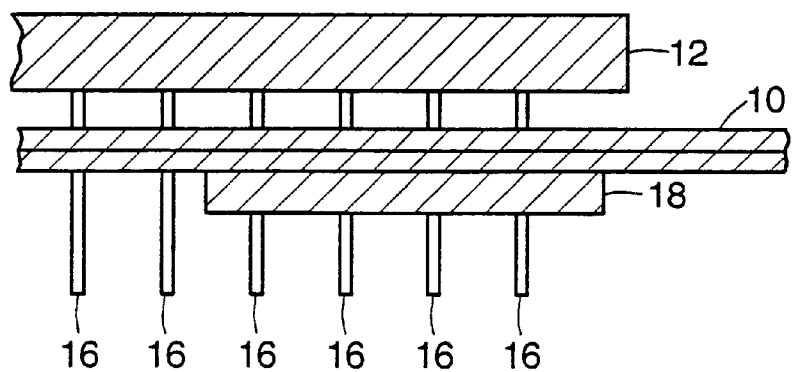
FIG. 1B is an enlarged cross-sectional view taken along line 1B—1B of FIG. 1A.

FIG. 1B shows that an electrical circuit component, such as the integrated circuit 12, is disposed on one side of the first printed circuit board 10. The electrical circuit component has pins or leads 16 that pass through holes in the first printed circuit board and protrude from these holes to an opposite side of the first printed circuit board. The leads also pass through holes in the second printed circuit board 18 which comprises the additional electrical circuit components needed for the modification to the integrated circuit 12. The second printed circuit board is attached to the first printed circuit board by placing holes of the second printed circuit board over the pins or leads. The second printed circuit board may then be attached to the first printed circuit board by soldering one or more of the pins or leads to its corresponding hole in the second printed circuit board.

Figure 1C:
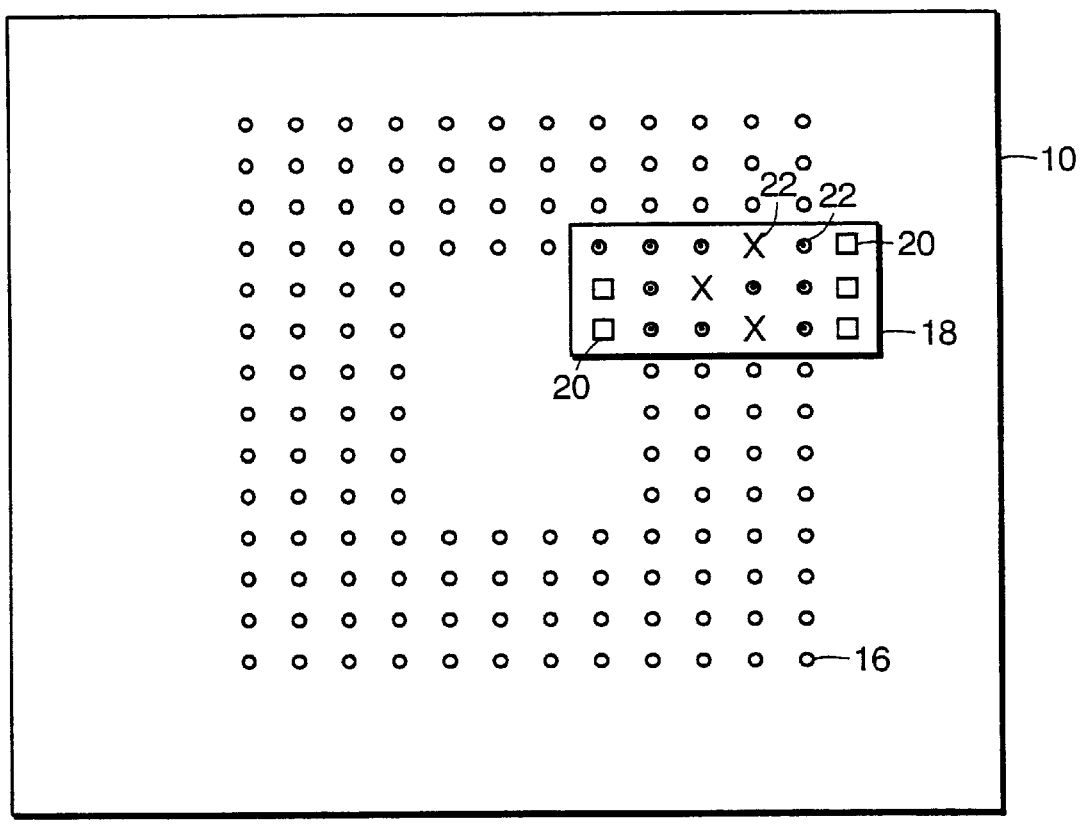
FIG. 1C is an enlarged plan view from the opposite side of the first printed circuit board of FIG. 1A.

As shown in FIG. 1C, an opposite side, or bottom, of the first printed circuit board of FIG. 1A has the attached second printed circuit board 18 as described above. The second printed circuit board comprises one or more additional circuit components 20, such as a capacitor, a resistor, or any combination thereof. Additionally, the second printed circuit board has holes 22 through which the pins or leads 16 of the integrated circuit 12 FIG. 1B pass. The holes 22 may be plated or unplated. The plated holes of the second printed circuit board are here indicated by an "X", and comprise a conductive metallic plating used to electrically connect the respective pin on the integrated circuit 12 to an electrical component or terminal line, for example, on the second printed circuit board 18 as will be described below. That is, the plated holes may complete a conductive path from a first component included in the first printed circuit board to a second component included in the second printed circuit board, as will be discussed in more detail in following text. Another purpose of the plated holes may be to indicate attachment points at which the first and second printed circuit boards are soldered together.

Figure 2:
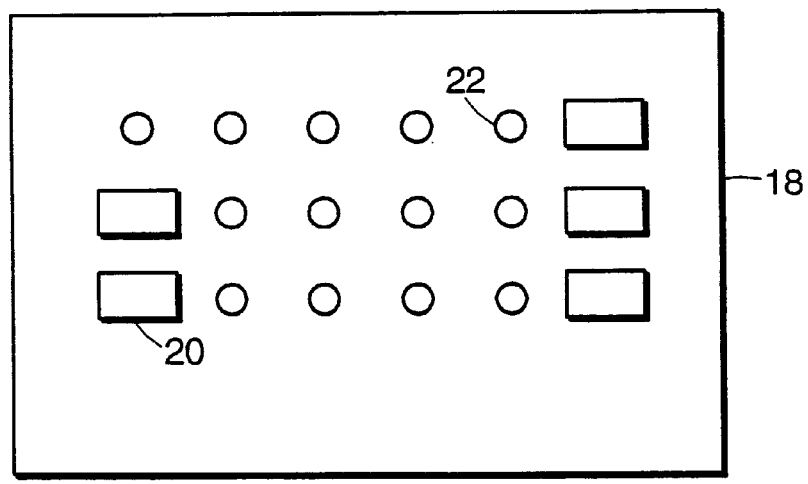
FIG. 2 is an enlarged plan view of a second printed circuit board.

As shown in FIG. 2, the second printed circuit board 18 may generally comprise holes 22 and one or more electrical circuit components 20. The electrical circuit components 20 may vary in type and number depending on the modification needed for the integrated circuit 12. For example, a modification that corrects a problem with the integrated circuit may require the second printed circuit board to comprise capacitors and resistors. Another modification may require only capacitors and no resistors.

The number of holes 22 and whether a hole is plated or unplated may also depend on the modification. Generally, if the component 12 that comprises the first printed circuit board has more pins or leads, there may be a larger number of holes in the second printed circuit board. Generally, if there are more electrical circuit components included on the second printed circuit board to be connected to a component on the first printed circuit board, there may be more plated holes because the number of connection points may increase.

Figure 3:
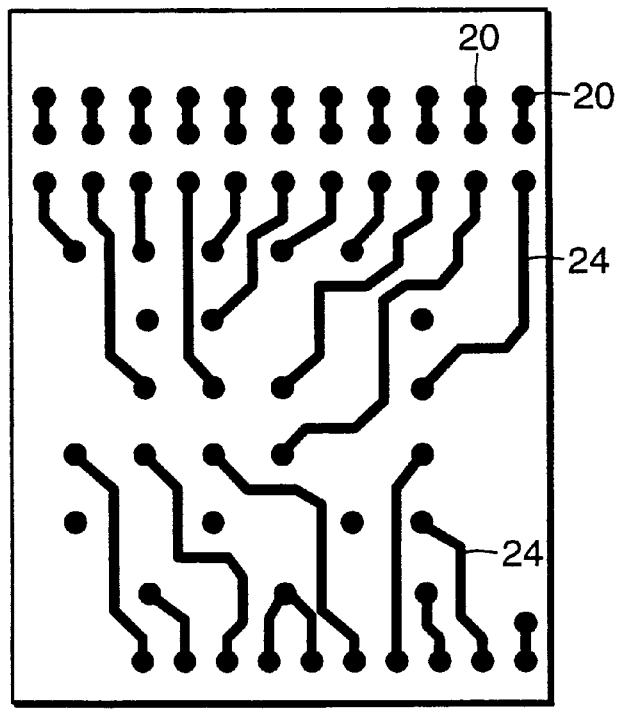
FIG. 3 is an enlarged plan view of the second printed circuit board having conductive paths.

Referring now to FIG. 3, the second printed circuit board is shown having a plurality of patterned electrical conductors 24. Each conductor is used to connect a first component 12 comprising the first printed circuit board 10 (of FIGS. 1A, 1B and C) to a second component 20 (of FIGS. C, 2, and 3) comprising the second printed circuit board 18. Disposed over the patterned conductors 24 is an insulating coating, such as insulating tape or a dielective layer to prevent electrical shorting between the first and second printed circuit boards.

In a preferred implementation embodying the invention, a single etch of a second printed circuit of FIG. 3 may be used for more than one modification in which each modification requires the addition of a different number or type of electrical circuit component. To accomplish this, the etch of the second printed circuit board of FIG. 3 may contain a number of conductive paths which is the maximum number of paths required of all the modifications. For example, the second printed circuit board may be used for applying two modifications. The first modification may require ten (10) capacitors. The second modification may require sixteen (16) capacitors and one (1) resistor and may require more conductive paths than the first modification. To use a single etch of a second printed circuit board in implementing both these modifications, the single etch of the second printed circuit board contains the maximum number of conductive paths as required by the second modification. For each modification, the number and type of electrical circuit components comprising the second printed circuit board may vary with each modification, but the same etch is used for each. For each modification, unused conductive paths are not connected. For example, some of the holes 22 in the second printed circuit board may be unplated for the first modification, but may be plated and soldered for the second modification.

Two different modifications may be required, for example, when applying a correction to a component having varied characteristics in several different models of the same unit, such as varying CPU chip characteristics.

The second printed circuit board and its components described in the foregoing may be designed to apply a modification to a first printed circuit board without adversely affecting the testing of the first printed circuit board. Typically, one method of testing a printed circuit board to determine manufacturing defects is in circuit testing (ICT). Generally, ICT uses one or more conductive metal pins or nails and tests a component by making contact between at least one of the metal pins and a conductive point electrically connected to the component on a printed circuit board. ICT may require that certain conductive points remain exposed on a surface of a printed circuit board, such as leads or pins 16 and other points which do not protrude from the printed circuit board. Therefore, to perform testing with an existing ICT fixture without modification may depend on both the thickness and surface area of the second printed circuit board. For example, testing may require that a lead or pin 16 remain exposed. Thus, the thickness of the attached second printed circuit board 18 may not exceed the height of a pin or lead, such as the height of a pin which passes through the first printed circuit board 10 (see FIG. 1B). Additionally testing may use certain conductive points exposed on the surface of the first printed circuit board requiring that the second printed circuit board have a specific shape or size.

Thus, a preferred implementation embodying the invention may include a second printed circuit board which is very thin, such as a thickness of 0.030+/0.004 mils. Additionally, due to the thickness, the second printed circuit board may be constructed of a sturdy core material generally known in the art of printed circuit board manufacturing, such as FR4. A second printed circuit board in a preferred implementation may also use very small electrical circuit components to minimize the surface area of the second printed circuit board.

The foregoing technique may also be used to terminate one or more electrical lines of one or more components populating the first printed circuit board. The termination can be through a circuit component, such as a resistor or capacitor, or can be a simple connection to ground or a supply voltage in a patterned conductor. By providing electrical termination, for example, to ground on the second printed circuit board for one or more lines from components on the first printed circuit board, the design of the first printed circuit board may be simplified by reducing the number of conductive paths. Additionally, the foregoing technique affords greater signal integrity by allowing a designer to minimize the distance between a component on the first printed circuit board and a component or a terminal line to an electrical ground on the second printed circuit board.

The foregoing technique affords a flexible way of implementing a wide variety of modifications that may be required for a printed circuit board. A modification, as described in preceding text, may be to correct a problem in a local area on an existing printed circuit board. Another modification may be to achieve additional functionality with an existing printed circuit board by adding electrical circuit components.

The invention affords an efficient and flexible way of applying a variety of modifications to a printed circuit board in a cost and time efficient manner. Additionally, a preferred implementation embodying the invention accomplishes this without adversely affecting testing and manufacturing reliability of a printed circuit board.

The foregoing technique for applying modifications does not impose restrictions or limit the effect of modifications, such as limit the physical proximity of capacitors added to dampen voltage produced by a component.

The foregoing technique also provides for modifying a printed circuit board by adding components that overcomes disadvantages and restrictions and which further provides a more efficient and desirable means of applying a modification to a printed circuit board.

Having described preferred embodiments of the invention, it will now become apparent to those of skill in the art that other embodiments incorporating its concepts may be provided. It is felt therefore that this invention should not be limited to the disclosed embodiments but rather should be limited only by the spirit and scope of the appended claims.

What is claimed is:

1. An apparatus comprising:
    a first printed circuit board comprising a first electrical circuit component on a first side of said first printed circuit board, said first printed circuit board having holes therein, said first electrical circuit component having one or more pins each passing through one of said holes in said first printed circuit board and each protruding from an opposite side of said first printed circuit board; and
    a second printed circuit board having one or more holes and being mounted directly to said opposite side of said first printed circuit board, said second printed circuit board being mounted solely by having said one or more pins of said first electrical circuit component protrude through at least one of said holes of said second printed circuit board, said second printed circuit board including one or more electrical circuit components connected to said first electrical component.

2. The apparatus of claim 1 wherein said second printed circuit board comprises at least one capacitor.

3. The apparatus of claim 1 wherein said second printed circuit board comprises at least one resistor.

4. The apparatus of claim 1 wherein said second printed circuit board comprises an etch of at least one conductive path, each conductive path connecting one of said pins of said first electrical component that protrudes through one of said holes in said first printed circuit board to one of said electrical circuit components on said second printed circuit board.

5. The apparatus of claim 1 wherein said second printed circuit board includes at least two holes and one of said two holes is plated with a conductive metal and the other of said two holes is unplated.

6. The apparatus of claim 1 wherein a combined thickness of said second printed circuit board and said first printed circuit board is less than or equal to a length of one of said protruding pins of said first electrical component.

7. An apparatus comprising:
    a first printed circuit board supporting a plurality of electrical components, a first one of said plurality of electrical components being mounted on a first side of said first printed circuit board, said first printed circuit board having holes therein, said first electrical circuit component having one or more pins each passing through one of said holes in said first printed circuit board and each protruding from an opposite side of said first printed circuit board;

a second printed circuit board having one or more holes and being mounted to said opposite side of said first printed circuit board with said one or more pins of said first electrical component protruding through at least one of said holes in said second printed circuit board, said second printed circuit board being vertically in alignment with said first electrical component and being comparably smaller in length and width than said first printed circuit board.

8. The apparatus of claim 7 wherein said second printed circuit board comprises at least one capacitor.

9. The apparatus of claim 7 wherein said second printed circuit board comprises at least one resistor.

10. The apparatus of claim 7 wherein said second printed circuit board comprises an etch of at least one conductive path, each conductive path connecting one of said pins of said first electrical component that protrudes through one of said holes in said first printed circuit board to one of said electrical circuit components on said second printed circuit board.

* * * * *